United States Patent [19]

Lazaar

[11] Patent Number: 5,015,555
[45] Date of Patent: May 14, 1991

[54] PHOTOPOLYMERIZABLE COMPOSITION CONTAINING HETEROCYCLIC TRIAZOLE

[75] Inventor: Kenneth I. Lazaar, Sayre, Pa.

[73] Assignee: E. I. Du Pont de Nemours and Company, Wilmington, Del.

[21] Appl. No.: 198,648

[22] Filed: May 27, 1988

Related U.S. Application Data

[63] Continuation of Ser. No. 867,437, May 28, 1986, abandoned.

[51] Int. Cl.$^5$ .............................................. G07C 1/275
[52] U.S. Cl. .................................... 430/281; 430/905; 430/910; 430/920; 522/9; 522/16; 522/63; 522/75; 524/91
[58] Field of Search ............... 430/281, 920, 905, 910; 524/91; 522/9, 16, 63, 75, 21

[56] References Cited

U.S. PATENT DOCUMENTS

| | | | |
|---|---|---|---|
| 3,622,334 | 11/1971 | Hurley | 430/281 |
| 3,662,334 | 11/1971 | Hurley | 430/281 |
| 4,298,678 | 11/1981 | McKeever | 430/281 |

FOREIGN PATENT DOCUMENTS

| | | | |
|---|---|---|---|
| 54-099250 | 8/1979 | Japan . | |
| 59208632 | 5/1986 | Japan | 430/281 |

OTHER PUBLICATIONS

Abstract of Japanese (J56024341) (3/7/1981), 81-3006717.

*Primary Examiner*—Jack P. Brammer

[57] ABSTRACT

Improved photosensitive compositions contain a heterocyclic triazole or its hydrate such as 1-hydroxy benzotriazole hydrate.

11 Claims, No Drawings

PHOTOPOLYMERIZABLE COMPOSITION CONTAINING HETEROCYCLIC TRIAZOLE

This is a continuation of application Ser. No. 06/867,437 filed May 28, 1986, now abandoned.

BACKGROUND OF THE INVENTION

The present invention relates to photosensitive compositions which contain an additive to influence one or more physical and/or chemical properties of the composition. Such properties can include, without limitation adhesion, adhesion coupled with flexibility, printout contrast and stripping of the composition from a substrate.

Photosensitive compositions particularly useful as photoresists are well known in the prior art. Conventionally these compositions are stored in roll form. The composition is adhered to a support film to form a two ply material such as disclosed in U.S. Pat. No. 4,293,635 or more conventionally in a three ply material such as U.S. Pat. No. 3,469,982 with the composition sandwiched between a support film and a coversheet. The photosensitive composition contains components of monomer, initiator and a polymeric binder which allows such composition to be negative working (i.e., exposure to actinic radiation hardens the film to make the exposed portion insoluble in a developer solution). The material is conventionally unwound from a roll, and the cover sheet if present is removed from contact with the photosensitive composition prior to use in lamination to a substrate. e.g., in manufacture of printed circuit boards. The laminated composition is exposed imagewise to actinic radiation with a support film stripped from the photosensitive composition before or after the exposure step. The unexposed areas of the starting light-sensitive layer are washed away in a development step to form resist image of polymeric material. The exposed portion of the substrate is conventionally etched or plated followed by removal of the polymeric resist image.

The photosensitive composition can contain many additives including an adhesion promoter which improves the ability of the photosensitive composition to remain adhered to a substrate upon lamination and through subsequent processing slips.

U.S. Pat. No. 3,622,334 discloses a photopolymer resist composition which contains as an adhesion promoter a small amount of a heterocyclic nitrogen containing compound of the formula

wherein R is substituted or unsubstituted ortho arylene, X is $CH_2$, NH, S, O or Se; Z is N or C—Y and Y is H, $NH_2$, halogen or alkyl.

A further disclosure of a photosensitive composition which contains a nitrogen containing compound is U.S. Pat. No. 4,298,678 This patent teaches incorporation into the photosensitive composition of a photooxidant leuco dye and a substituted hydroxylamine compound of the formula $R_1R_2NOH$ where $R_1$ and $R_2$, e.g., are alkyl, cyclic alkyl, aryl, aralkyl, alkaryl and $R_1$ and $R_2$ taken together from a heterocyclic ring of 5 to 7 carbon atoms. Named compounds which include a heterocyclic ring are N-hydroxypyrolidine and N-hydroxypiperidine.

SUMMARY OF THE INVENTION

The present invention is directed to an improved photopolymerizable composition comprising
(a) at least one nongaseous ethylenically unsaturated compound having a boiling point above 100° C. at normal atmospheric pressure and being capable of forming a high polymer by photoinitiated addition polymerization,
(b) an initiating system activated by actinic radiation, and
(c) a preformed macromolecular binder wherein the improvement comprises incorporation into said composition an additive of a heterocyclic triazole or its hydrate of the formula:

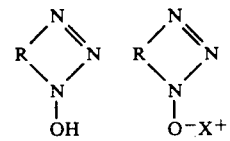

wherein R is orthoarylene or orthoarylene substituted with an alkyl, cyclic alkyl, aryl, aralkyl or alkaryl and $X^+$ is a cation.

DETAILED DESCRIPTION OF THE INVENTION

The starting material for the photosensitive composition of the present invention ordinarily present as a film on a flexible backing material are well known in the prior art with the exception of a class of hydroxy heterocyclic triazole additive disclosed herein. Although the prior art discloses various triazoles including benzotriazoles in photosensitive compositions which are particularly useful as adhesion promoters, i.e.. improves the ability of the photosensitive composition to remain adhered to a substrate upon lamination and in subsequent processing steps, the prior art does not disclose the named class of hydroxy heterocyclic triazole disclosed herein. Additionally the hydroxy heterocyclic triazole of the present invention can function in a manner not disclosed by the prior art since their use can affect several of the following properties, including flexibility and exposed adhesion of the photosensitive composition, instant adhesion of the photosensitive composition to a substrate, printout image of a photosensitive composition subsequent to a step of imagewise exposure and stripping time of the exposed composition from a substrate.

The photosensitive composition will contain the one of a specific class of triazole additives together with one or more addition polymerizable ethylenically unsaturated monomers, an initiating system activated by actinic radiation. The triazole or its hydrate is of the formula:

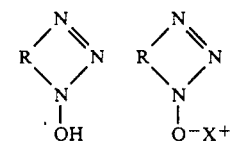

wherein R is orthoarylene which may be substituted and X is a cation.

R can be an orthoarylene which may be substituted with an alkyl cyclic alkyl aryl. aralkyl or alkaryl group A preferred class of alkyl are $C_1$ to $C_{24}$ and more preferably $C_1$ to $C_8$. Preferred cyclic alkyl contains at least 3 carbon atoms and more preferably not more than 8 atoms. Preferred aryl contains 6 to 10 carbon atoms and more preferably aryl is phenyl. The other defined constituents are of the same scope. Examples of $X^+$ are ammonium sodium, potassium or alkyl substituted ammonia where alkyl is as defined above. A preferred species is 1-hydroxy benzotriazole hydrate or its ammonium salt.

Generally the concentration of the named class of triazole derivatives will be present in an amount from 0.01 to 2.0 percent based on the weight of the photosensitive composition and more specifically in a range from 0.1 to 0.4 percent.

The ability of the heterocyclic triazole derivative to effect flexibility and exposed adhesion of the photosensitive composition is a test in which the composition is applied to a substrate and exposed to actinic radiation prior to performing the test. This test determines the ability of the exposed resist to remain firmly adhered to a substrate, such as copper, without cracking or lifting when such exposed resist is subjected to an external stress. Such procedure can be in accordance with ASTM D 3359-78 Standard Method B wherein a perpendicular lattice patterned is cut in the resist. Pressure sensitive tape is applied to the surface of the resist followed by removal of the tape which can cause damage or removal of the resist.

A further test of the ability of the triazole derivative to effect characteristics of the photosensitive composition is an instant adhesion test. A layer of photosensitive composition that is on a support film is applied to a substrate, such as a copper clad fiber glass epoxy panel, and immediately or a short time thereafter the support film is removed from the photosensitive composition. Thereafter pressure sensitive tape is applied to the surface of the composition. After about one and one half minutes the tape is peeled at a constant angle from the surface of the composition which can cause its removal with the tape.

Another criteria for testing the derivative in effecting a change in a photosensitive composition is the ability to enhance the printout image and is a visual test. Use of the photosensitive material particularly as a photoresist conventionally involves imagewise exposure with actinic radiation of the material through a photomask. Due to the exposure a visible image is photochemically formed in the exposed portion which contrasts to unexposed portions of the film. The quality of the printout image is evaluated visually by the change in optical density or its contrast with unexposed areas. This printed image can be used by an operator to evaluate alignment and exposure conditions and to make changes to allow optimum processing.

Another manner of evaluating the triazole derivative lies in determining time to remove a developed photopolymerized image from a substrate, called the time to strip. For such determination a photosensitive film is applied to a substrate and processed to give a developed image on a substrate. The substrate is normally either etched or plated, followed by removal i.e., stripping of the remaining photopolymerized image. In printed circuit manufacture the time of stripping is a factor for throughput since higher stripping rates, i.e., shorter stripping times, allow increased production.

In addition to the named class of derivatives the polymerizable composition will contain at least one nongaseous unsubstituted compound. i.e., a monomer, having a boiling point above 100° C. at normal atmospheric pressure and being capable of forming a high polymer by photoinitiated addition polymerization, an initiating system activated by actinic radiation and a preferred macromolecular binder.

Suitable monomers which can be used as the sole monomer or in combination with others include the following: t-butyl acrylate, 1,5-pentanediol diacrylate. N,N-diethylaminoethyl acrylate, ethylene glycol diacrylate, 1,4-butanediol diacrylate diethylene glycol diacrylate, hexamethylene glycol diacrylate. 1.3-propanediol diacrylate decamethylene glycol diacrylate, decamethylene glycol dimethacrylate. 1,4-cyclohexanediol diacrylate, 2,2-dimethylolpropane diacrylate, glycerol diacrylate, tripropylene glycol diacrylate glycerol triacrylate, trimethylolpropane triacrylate, pentaerythritol triacrylate polyoxyethylated trimethylolpropane triacrylate and trimethacrylate and similar compounds as disclosed in U.S. Pat. No. 3,380,831,2,2-di(p-hydroxyphenyl)-propane diacrylate, pentaerythritol tetraacrylate, 2,2-di-(p-hydroxyphenyl)-propane dimethacrylate, triethy lene glycol diacrylate, polyoxyethyl-2,2-di-(p-hydroxyphenyl)-propane dimethacrylate di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A di-(2-methacryloxyethyl) ether of tetrabromo-bisphenol-A, di-(3-methacryloxy2-hydroxypropyl) ether of 1,4-butanediol. di-(3-methacryloxy-2-hydroxypropyl) ether of diphenolic acid, triethylene glycol dimethacrylate, polyoxypropyltrimethylol propane triacrylate (462). ethylene glycol dimethacrylate butylene glycol dimethacrylate 1,3-propanediol dimethacrylate 1,2,4-butanetriol trimethacrylate 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate diallyl fumarate, styrene, 1,4-benzenediol dimethacrylate, 1,4-diisopropenyl benzene and 1,3,5-triisopropenyl benzene.

A class of monomers is an alkylene or a polyalkylene glycol diacrylate prepared from an alkylene glycol of 2 to 15 carbons or a polyalkylene ether glycol of 1 to 10 ether linkages and those disclosed in U.S. Pat. No. 2,927,022, e.g. those having a plurality of addition polymerizable ethylenic linkages particularly when present as terminal linkages. Especially preferred are those wherein at least one and preferably most of such linkages are conjugated with a double bonded carbon, including carbon double bonded to carbon and to such heteroatoms as nitrogen oxygen and sulfur. Outstanding are such materials wherein the ethylenically unsaturated groups, especially the vinylidene groups, are conjugated with ester or amide structures.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10- anthraquinone, 1-chloroanthraquinone, 2-chloroanthraquinone 2-methylanthraquinone 2-ethylanthraquinone 2-tert-butylanthraquinone octamethylanthraquinone, 1,4-naphthoquinone, 9,10-phenanthrenequinone, 1,2-benzanthraquinone, 2,3-benzanthraquinone 2-methyl-1,4-naphthoquinone, 2,3-dichloronaphthoquinone, 1,4-dimethylanthraquinone, 2,3-dimethylanthraquinone. 2-phenylanthraquinone. 2-3-diphenylanthraquinone, sodium salt of anthraquin one alpha-sulfonic acid, 3-chloro-2-methylanthraquinone, retenequinone 7,8,9,10-tetrahydronaphthacenequinone and 1,2,3,4-tetrahydrobenz(a)anthracene7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; α-hydrocarbon-substituted aromatic acyloins, including α-methylbenzoin α-allylbenzoin and α-phenylbenzoin. Photoreducible dyes and reducing agents disclosed in U.S. Pat. Nos. 2,850,045; 2,875,047; 3,097,096; 3,074,974; 3,097,097; and 3,145,104 as well as dyes of the phenazine, oxazine, and quinone classes; Michler's ketone, benzophenone, 2,4,5-triphenyl-imidazolyl dimers with hydrogen donors, and mixtures thereof as described in U.S. Pat. Nos. 3,427,161; 3,479,185; and 3,549,367 can be used as initiators. Similarly the cyclohexadienone compounds of U.S. Pat. No. 4,341,860 are useful as initiators. Also useful with photoinitiators and photoinhibitors are sensitizers disclosed in U.S. Pat. No. 4,162,162.

Suitable binders which can be used alone, if employed, or in combination with one another include the following: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate: ethylene/vinyl acetate copolymers: polystyrene polymers and copolymers, e.g. with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers e.g., polyvinyl chloride/acetate; saturated and unsaturated polyurethanes: synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene. styrene/isoprene/styrene block copolymers; high molecular weight polyethylene oxides of polyglycols having average molecular weights from about 4,000 to 1,000,000: epoxides, e.g.. epoxides containing acrylate or methacrylate groups; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids (2) terephthalic, isophthalic and sebacic acids. (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic sebacic and adipic acids: nylons or polyamides e.g. N-methoxymethyl polyhexamethylene adipamide; cellulose esters. e.g.. cellulose acetate cellulose acetate succinate and cellulose acetate butyrate; cellulose ethers. e.g., methyl cellulose ethyl cellulose and benzyl cellulose: polycarbonates; polyvinyl acetal. e.g., polyvinyl butyral, polyvinyl formal: polyformaldehydes.

In the case where aqueous development of the photosensitive composition is desirable the binder should contain sufficient acidic or other groups to render the composition processible in aqueous developer. Useful aqueous-processible binders include those disclosed in U.S. Pat. No. 3,458,311 and in U.S. Pat. No. 4,273,857. Useful amphoteric polymers include interpolymers derived from N-alkylacrylamides or methacrylamides, acidic film-forming comonomer and an alkyl or hydroxyalkyl acrylate such as those disclosed in U.S. Pat. No. 4,293,653. For aqueous development the photosensitive layer will be removed in portions Which are not exposed to radiation but will be substantially unaffected during development by a liquid such an aqueous solutions containinq 2% sodium carbonate by weight.

In addition to the above named components the photopolymerization composition can contain various other additives such as thermal polymerization inhibitors, dyes, pigments, fillers and other materials which are added to influence characteristics of the composition.

Thermal polymerization inhibitors that can be used in photopolymerizable compositions are: p-methoxyphenol, hydroquinone, and alkyl and aryl-substituted hydroquinones and quinones, tert-butyl catechol, pyrogallol copper resinate, naphthylamines. beta-naphthol, cuprous chloride, 2,6-di-tert-butyl-p-cresol, phenothiazine, pyridine, nitrobenzene and dinitrobenzene p-toluquinone and chloranil. Also useful for thermal polymerization inhibitors are the nitroso compositions disclosed in U.S. Pat. No. 4,168,982.

Various dyes and pigments may be added to increase the visibility of the resist image. Any colorant used however should preferably be relatively transparent to the actinic radiation used.

In use the photosensitive composition for application to a substrate such as in making a printed circuit board is conventionally supplied by a film which is well known in the art.

A suitable support preferably having a high degree of dimensional stability to temperature changes may be chosen from a wide variety of films composed of high polymers, e.g. polyamides, polyolefins, polyesters vinyl polymers, and cellulose esters. A preferred support for the present invention is polyethylene terephthalate. Generally a cover sheet is present on the appropriate side of the photosensitive composition present in film form. The protective cover sheet is removed prior to lamination of the photosensitive composition to a substrate. The cover sheet may be chosen from the same group of polymer films listed as supports. Polyethylene and polyethylene terephthalate are particularly useful.

Although in the above disclosure the photosensitive compositions have been disclosed as containing a polymeric binder it is understood that suitable compositions which can function for example as photoresists need not contain a conventional binder. In such case the photosensitive composition need only contain (1) an addition polymerizable ethylenically unsaturated monomer. (2) an initiating system activated by actinic radiation and (3) a microgel which serves as the binder. Generally the percentage of these components on the basis of these three constituents will be by weight 10% to 60% and preferably 15% to 35% for component (1); 0.01% to 15% and preferably 2% to 10% for component (2) and 25% to 90% and preferably 30% to 65% for component (3). It is understood that in such compositions a conventional preformed polymer binder need not be present but conventional additives can be added such as those previously mentioned.

A preferred use of compositions characterized herein is as a photoresist or a solder mask such as in making a printed circuit board. Such techniques are conventional in the art employing a solid material, e.g. U.S. Pat. No. 3,469,982, The process is directed to laminating a photosensitive or a substrate comprising:

(a) laminating to the substrate a supported solid photosensitive film,
(b) imagewise exposing the layer to actinic radiation,
(c) removing unexposed areas of the layer to form resist areas,
(d) permanently modifying areas of the substrate which are unprotected by the resist areas by etching the substrate or by depositing a material onto the substrate.

The support is conventionally removed before or after the exposure step. In the case of solder mask utility the step of depositing a material can be by application of solder. In a utility not involving direct use as a solder mask in initial application to a substrate (which is conductive with copper preferred circuitry therein) the resist areas are removed after step (d) which is conventional.

The following examples serve to illustrate the practice of the present invention. All percentages, ratios and parts are by weight unless otherwise indicated.

EXAMPLE 1

Part A

Preparation of Binder B

The emulsion polymerization apparatus can be a 5 liter, 4 necked flask equipped with a mechanical stirrer, 1 liter addition funnel, thermometer, nitrogen inlet, water cooled condenser and a heating mantle. Charge the flask with 3360 g of deionized water and 20 g of a 30% aqueous solution of sodium lauryl sulfonate and heat this surfactant system to 80° C. under a nitrogen atmosphere. At that temperature add in one shot 25% of a monomer mixture consisting of 420 g methylmethacrylate, 240 g ethyl acrylate, 165 g methacrylic acid. 16 g allyl methacrylate. Follow immediately by the addition of 10 ml of a 5% aqueous solution of potassium persulfate and 10 ml of a 7% aqueous solution of potassium phosphate. Add the remainder of the monomer mixture over a period of 90 minutes while maintaining the temperature between 80°-88° C. When the addition is finished, heat the reaction mixture for an additional 2 hours at 80°-85° C. Cool to room temperature and coagulate by adding methanol. Filter the resulting slurry, wash twice with water, suck dry and then dry the resulting fine powder in an oven at 100° C. for four hours.

Part B

Comparative hotoresist coating compositions were prepared having the following components in part by weight.

| COMPONENT | A | B | C |
| --- | --- | --- | --- |
| Polymer binder methylmethacrylate/ethylacrylate/methacrylic acid 51/29/20 mol. wt. 50.000. acid no. 130, Tg 87° C. | 50.5 | 50.5 | 50.5 |
| Binder B | 10.0 | 10.0 | 10.0 |
| Polyox ® WSRN-3000 polyethyloxide mol. wt. 400,000 | 0.5 | 0.5 | 0.5 |
| Ethoxylated trimethylolpropane triacrylate monomer | 22.0 | 22.0 | 22.0 |
| Itaconic acid | 0.5 | 0.5 | 0.5 |
| N-Morpholino ethyl acrylate | 1.5 | 1.5 | 1.5 |
| Urethane diacrylate monomer | 3.5 | 3.5 | 3.5 |
| Ethyl paradimethylaminobenzoate | 4.3 | 4.3 | 4.3 |
| Michler's ketone | 0.15 | 0.15 | 0.15 |
| Benzophenone | 6.4 | 6.4 | 6.4 |
| 4-Methyl-4-trichloromethyl-cyclohexadienone | 0.1 | 0.1 | 0.1 |
| Leuco Crystal Violet | 0.3 | 0.3 | 0.3 |
| Diethyl hydroxylamine | 0.2 | 0.2 | 0.2 |
| Victoria Green C.I. #42000 | 0.04 | 0.04 | 0.04 |
| Victoria Blue C.I. #42575 | 0.02 | 0.02 | 0.02 |
| Hydroxy ethyl morpholine | 2.0 | 2.0 | 2.0 |
| Benzotriazole | 0.4 | 0 | 0 |
| 5-Nitro benzotriazole | 0 | 0.55 | 0 |
| 1-Hydroxy benzotriazole hydrate | 0 | 0 | 0.45 |
| Methylene chloride | 186 | 186 | 186 |
| Methanol | 14 | 14 | 14 |

Films of approximately 1.5 mil thickness were produced after coating on a polyethyleneterephthalate film support and drying to remove methylene chloride and methanol.

Film samples were conventionally laminated to the copper surface of a copper clad epoxy substrate, imaqewise exposed and developed in 1% by weight aqueous sodium carbonate solution. The processed compositions were tested for photoresist properties of (1) flexibility and adhesion, (2) instant adhesion, (3) printout image contrast, and (4) strippinq time using the following test procedures:

The flexibility and adhesion criteria (also designated as "F&A") is the ability of exposed laminated resist to remain firmly adhered to the copper substrate without cracking or lifting when it is flexed or bent. This characteristic is measured using a cross-cut tape test based on ASTM D 3359-78 Standard Method B for measuring adhesion by Tape test. In the test, a perpendicular lattice pattern with either six or eleven cuts in each direction separated by one or two mm is made in the laminated, exposed and developed resist film. A 3/4 inch (19 mm) wide semi-transparent pressure-sensitive tape (Scotch ® Brand 810 Magic Transparent Tape) is applied to the cross-cut grid area and smoothed into place with pressure. Within 90±30 seconds the tape is rapidly pulled off the grid area at as close to an angle of 180° as possible. The grid area is inspected and rated according to the following scale:

Grade

5 - The edges of the cuts are completely smooth; none of the squares of the lattice is detached.

4 - Small flakes of the resist are detached at intersections; less than 5% of the area is affected.

3 - Small flakes of the resist are detached along edges and at intersections of cuts. The area affected is 5 to 15% of lattice.

2 - The resist has flaked along the edges and on parts of the squares. The area affected is 15 to 35% of the lattice.

1 - The resist has flaked along the edges of cuts in large ribbons and whole squares have detached. The area affected is 35 to 65% of the lattice.

0 - Flaking and detachment worse than Grade 1.

The instant adhesion criteria (also designated "IA") is the ability of a resist film to resist delamination, e.g., when the film support is removed or the panel is trimmed immediately after lamination, i.e., within about 15 to 20 minutes and before imaging exposure. Instant adhesion is measured by first removing the support film from a laminated resist panel and then adhering under finger pressure a uniform length of a .1 inch (25 mm) wide Scotch ® Brand Masking Tape to the surface of the rest. Within 90±30 seconds, the tape is peeled back at a constant angle between 90 and 180 deg) in one quick motion. The degree of instant adhesion, IA, is rated according to the percent of resist removed with the tape using the following scale:

Scale

5—No resist removed.
4—Up to 25% resist removed.
3—25% to 50% resist removed.
2—50% to 75% resist removed.
1—75% to 100% resist removed.

printout image (also identified as "P/O" is a photochemically formed visible colored image in the imagewise exposed film before development and is used by an operator to evaluate alignment and exposure conditions before further processing. The quality of the printout image is determined by the change in optical density or its contrast with respect to the unexposed areas of the photoresist. Although the printout can be quantified by measuring optical density change at specified wavelengths corresponding to the $\lambda_{max}$ of the colorant formed, simple visual comparison with a "control" sample typically is used to evaluate the quality of a printout image. Using this comparative procedure the quality of the printout image can be ranked as follows:

| Rank | |
|---|---|
| = | the control or equivalent to the control |
| + | better than the control |
| ++ | much better than the control |
| − | poorer than the control |
| −− | much poorer than the control |

The time-to-strip criteria (also identified as TTS) is measured by immersing an exposed and developed (and optionally etched or plated) resist laminated printed circuit board of specified dimensions in a stirred 1.5% KOH aqueous solution at 130° F. (54.4° C.). The time to strip, TTS, is identified as the time in seconds for the resist to be completely removed from the copper surface.

Coatings A, B, and C were evaluated using the four criteria identified above and results are presented in Table I.

TABLE 1

| Coating | F & A | IA | P/O | TTS |
|---|---|---|---|---|
| A (Benzotriazole) | 1 | 2 | = | 39 |
| B (5-Nitrobenzotriazole) | 1 | 4 | − | |
| C (1-Hydroxy benzotriazole hydrate) | 5 | 5 | ++ | 39 |

The results indicate a marked improvement for printout and adhesion criteria when hydroxy benzotriazole in Coating C is substituted for the conventional adhesion promoter in Coating A. Also Coating C was superior to Coating B with 5-nitrobenzotriazole.

Part C

Coatings similar to Coating C were prepared with 0.45, 0.35 and 0.25 parts by weight of 1-hydroxy benzotriazole hydrate. Test results were substantially the same as for Coating C indicating that only a minor amount of the hydroxy benzotriazole (HBT) is needed to achieve the marked improvements. Films containing HBT stripped faster than a control which did not contain any adhesion promoter.

| | TTS |
|---|---|
| D (no additional additive) | 31 |
| E (HBT 0.25%) | 28.5 |
| F (HBT 0.35%) | 29.5 |
| G (HBT 0.45%) | 26.5 |

EXAMPLE 2

Four photoresist coating compositions were prepared as in Example 1 having the Master Composition given below and each containing the added component presented in Table 2.

| Master Composition | |
|---|---|
| Component | Parts By Weight |
| Polymer binder methylmethacrylate/-ethylacrylate methacrylic acid 51/29/20 mol. wt. 50,000, acid no. 130 Tg 87° C. | 52.5 |
| Binder B | 10.0 |
| Ethoxylated trimethylolpropane triacrylate monomer | 24.5 |
| Itaconic acid | 0.5 |
| Urethane diacrylate monomer | 4.0 |
| Ethyl paradimethylaminobenzoate | 2.0 |
| Michler's ketone | 0.15 |
| Benzophenone | 5.2 |
| 4-Methyl-4-trichloromethyl cyclohexadienone | 0.1 |
| Leuco Crystal Violet | 0.3 |
| Diethyl hydroxylamine | 0.2 |
| Victoria Green C.I. #42000 | 0.02 |
| Victor Blue C.I. #42575 | 0.02 |
| 1,4,4-Trimethyl-2,3-diazabicyclo[3.2.2]-non-2-ene-N,N-dioxide | 0.03 |

The components added to the Master Composition were either benzotriazole (identified as BT) or 1-hydroxy benzotriazole (identified as HBT) in the amounts given in parts by weight in Table 2. The coatings were evaluated as described in Example 1 and results are presented in Table 2.

TABLE 2

| Formulation | | | Properties | | | |
|---|---|---|---|---|---|---|
| Coating | BT | HBT | F & A | IA | P/O | TTS |
| H | 0.1 | 0 | 3 | 1 | = | 52 |
| I | 0 | 0.4 | 5 | 5 | + | 43 |
| J | 0 | 0.8 | 5 | 5 | ++ | 38 |
| K | 0 | 1.2 | 5 | 5 | +++ | 39 |

Results indicate marked improvement in all aspects tested. The results indicate that flexibility and adhesion, instant adhesion printout contrast and stripping are simultaneously improved when HBT is substituted for the conventional adhesion promoter BT. In addition the printout contrast and strip rate increase with increasing concentration of HBT.

EXAMPLE 3

A photoresist coating composition was prepared having the following composition and added and stirred in the sequence as given:

| Component | Parts By Weight |
|---|---|
| Methylene chloride | 2492.5 |
| Methanol | 187.6 |
| Ethoxylated trimethylolpropane triacrylate monomer | 277.2 |
| Trimethylolpropane triacrylate | 92.4 |
| Aluminum (acetylacetonate)$_3$ | 6.6 |
| Stir for 15 minutes | |
| Binder B | 125.4 |
| Stir for 2 hours | |
| Polymer binder methylmethacrylate/-ethylacrylate methacrylic acid 51/29/20 mol. wt. 50,000, acid no. 130 Tg 87° C. | 679.8 |
| Stir for 1 hour | |
| Benzophenone | 69.96 |
| Ethyl paradimethylaminobenzoate | 52.8 |
| 4-Methyl-4-trichloromethylcyclohexadienone | 1.32 |
| Ethyl Michler's ketone | 2.64 |
| Diethyl hydroxylamine | 0.92 |
| Victoria Green, C.I. #42000 | 0.53 |
| Victoria Blue, C.I. #42575 | 0.40 |
| Leuco Crystal Violet | 3.96 |

After further stirring, the solution was coated onto a web of 1 ml thick polyethylene terephthalate film and dried to give a dry coating thickness of 1.5 mil and identified as Coating "L". A 1 mil thick polyethylene protective film was temporarily laminated to the photoresist layer.

Three additional coatings were prepared the same way but had the following added components:

| Coating | Component | PBW |
|---|---|---|
| M | Benzotriazole (BT) | 2.98 |
| N | 1-Hydroxy benzotriazole hydrate (HBT) | 3.38 |
| O | 1-Hydroxy benzotriazole Ammonium Salt (AHBT) | 3.83 |

Each of the coatings were evaluated as described in Example 1 and results are presented in Table 3.

TABLE 3

| Coating | Formulation | | | Properties | | | |
|---|---|---|---|---|---|---|---|
| | BT | HBT | AHBT | F & A | IA | P/O | TTS |
| L | — | — | — | 0 | 4 | = | 67 |
| M | 2.98 | — | — | 0 | 1 | = | 55 |
| N | — | 3.38 | — | 4 | 4(5) | +(++) | 47 |
| O | — | — | 3.83 | 3 | 4(5) | +(++) | 63 |

Coating L, with no additive, and Coating M, with benzotriazole performed poorly in the flexibility and adhesion test; Coating N, with hydroxy benzotriazole, and Coating O, with the ammonium salt of hydroxy benzotriazole, performed substantially better than Coatings L and M. Coatings N and O also demonstrated substantially better instant adhesion than Coating M. This property continued to improve when tested 90 minutes after lamination (see value in parentheses) for Coatings N and O; no further improvement in IA with time was observed for Coatings L and M.

Coating N, with hydroxy benzotriazole, and Coating O, with the ammonium salt of hydroxy benzotriazole had better initial printout images than Coatings L or M; the printout image of Coatings N and O, unlike those of Coatings L and M, continued to improve (see value in parentheses) when held for 30 minutes after exposure. Finally, Coating N with hydroxy benzotriazole stripped significantly faster than Coating L with no additive or Coating M with benzotriazole.

EXAMPLE 4

Comparative photoresist coating compositions were prepared having the following components in parts by weight.

| Component | P | Q |
|---|---|---|
| Methylene chloride | | 189 |
| Methanol | | 12 |
| 2-Ethoxy ethanol | | 2 |
| 2,2'-bis-(o-chlorophenyl)-4,4', 4,4'-tetraphenyl biimidazole | | 2.0 |
| Polyoxyethylated trimethylol propane triacrylate (20 mols of ethylene oxide) MW 1162 | | 2.0 |
| Styrene/maleic anhydride copolymer partially esterified with isobutyl alcohol MW 20,000, acid no. 180 | | 37.0 |
| Terpolymer of 17% ethyl acrylate, 71% methylmethacrylate, and 12% acrylic acid; MW 300,000, acid no. 105 | | 10.0 |
| Aerosol OT 100 (sodium dioctyl sulfosuccinate) | | 5.0 |
| Pluronic 31R1 (block copolymer of polyethylene and polypropylene oxides, MW 3200) | | 0.74 |
| Michler's ketone | | 0.2 |
| Diethylhydroxylamine | | 0.3 |
| Trimethylolpropane triacrylate | | 42.0 |
| Leuco Crystal Violet | | 0.25 |
| N-phenyl glycine | | 0.1 |
| Crystal Violet | | 0.005 |
| Victoria Green (C.I. Basic Green 4) | | 0.04 |
| Benzotriazole | 0.04 | 0 |
| Hydroxy benzotriazole | 0 | 0.05 |

Each solution was coated onto 0.92 a mil thick polyethylene terephthalate film support and dried to give a dry coating thickness of 1.5 mil. The surface of each dried coating was laminated with a 0.90 mil thick polyethylene protective cover sheet.

Each sample was tested for alkaline etch retardation which is a degradation of alkaline etching performance when a resist laminated to printed circuit board is held for a period of time before imagewise exposure and further processing. The maximum hold time before alkaline etch retardation occurred was eValuated for Coating p and Q.

Three samples each of coating p and of Coating Q were conventionally laminated to a scrubbed surface of a copper clad glass-epoxy printed circuit substrate and held for 1, 2 or 8 days before identical processing by conventional imagewise exposure, development and alkaline etching using the same conditions. The results summarized in Table 4 indicate that Coating Q with HBT could be held on copper without alkaline etch retardation for at least 8 days were a Coating p with benzotriazole showed etch retardation one day after lamination.

TABLE 4

| Hold Time (days) | Coating P | Coating Q |
|---|---|---|
| 1 | Some Etch Retardation | Etched Cleanly |
| 2 | Did Not Etch | Etched Cleanly |
| 8 | Did Not Etch | Etched Cleanly |

EXAMPLE 5

Comparative solvent processible coating compositions were prepared having the following components in parts by weight:

| Ingredient | R | S |
|---|---|---|
| Trimethylolpropane ethoxylated triacrylate MW 400 ± 50* | | 30.9 |
| Benzophenone | | 4.0 |
| Ethyl Michler's ketone | | .15 |
| 4-Methyl-4-trichloromethyl cyclohexadiene-1-one | | 0.1 |
| Poly(methylmethacrylate/ethylmethacrylate 75/25, inherent viscosity 0.49 | | 56.0 |
| Victoria Green Dye (C.I. 42000) | | 0.04 |
| Victoria Blue Dye (C.I. 42595) | | 0.03 |
| P Toluene sulfonic acid | | 0.05 |
| HFS** | | 3.85 |
| Santicizer ®9 (mixed o and p toluene sulfonamide) | | 4.28 |
| Tris-(4-diethylamino-2-tolyl) methane | | 0.15 |
| Leuco Crystal Violet | | 0.25 |
| Propylene glycol methyl ether | | 11 |
| Methylene chloride | | 175 |
| 5-Chloro benzotriazole | 0.2 | 0 |
| 1-Hydroxy benzotriazole | 0 | 0.2 |

*Trimethylolpropane ethoxylated triacrylate (TMPEOTA) has the following ethoxylate distribution which constitutes a minimum of 92% of the distribution
None        6% Max
Monoethoxy  10–20%
Diethoxy-1  12–18%
Diethoxy-2  14–21%
Triethoxy-1 21–29%
Triethoxy-2 6–10%
Tetraethoxy 12–20%
**HFS is a condensation polymer of hydantoin, formaldehyde and mixed o and p toluene sulfonamide formulated with phthalic anhydride.

Each solution was coated on a 0.001 inch thick polyethylene terephthalate support film to give a dry coating thickness of 0.002 inch.

Each dried coating is laminated to a copper clad circuit board substrate which was scrubbed with an abrasive brush using a Riston ® hot roll laminator. The laminated board is imagewise exposed through a 6√2 Stouffer ®41 stepwedge using a Riston ® PC 24 exposure device and developed in a Riston ® C processor (at 60° to 70° F. with 20 psi spray pressure) containing stabilized 1,1,1,-trichloroethane as the developer solvent.

The coating containing 1-hydroxy benzotriazole produced a printout image which was superior to one from the coating containing 5-chloro benzotriazole.

Instant adhesion was tested as in Example 1 at times 30 minutes, 1 hour, 3 hours, and 7 hours after lamination. In the case of 5-chloro benzotriazole, 100% of the resist was removed even after 7 hours. i.e., a ranking of "1". In the case of 1-hydroxy benzotriazole, instant adhesion at 30 minutes has a ranking of 4 and climbs to 5 within 3 hours of lamination.

Time to strip was measured for both coatings using the procedure of Example 1 except that methylene chloride at a temperature of 22° C. was used as the stripping solution. The 5-chloro benzotriazole resist coating stripped in 14.9 seconds whereas the 1-hydroxy benzotriazole resist coating stripped in only 12 seconds.

EXAMPLE 6

A coating composition having the following components is coated on a 1 mil polyethylene terephthalate film support and dried to give a thickness of 0.001 inch.

| Component | Parts By Weight |
|---|---|
| Terpolymer of 17% ethyl acrylate, 71% methylmethacrylate, and 12% acrylic acid; mol. wt. ca. 300,000; acid number ca. 105 | 2 |
| Interpolymer formed from 40% N-tert.-octyl acrylamide, 34% methylmethacrylate, 16% acrylic acid, 6% hydroxy propyl methacrylate, and 4% t-butyl amino ethyl methacrylate; mol. wt. ca. 500,000 | 63.85 |
| Trimethylolpropane triacrylate | 10.0 |
| Triethylene glycol dimethacrylate | 10.0 |
| Benzophenone | 8.0 |
| 4,4'-Bis(diethylamino) benzophenone | 0.12 |
| 2,2'-Bis(2-chlorophenyl)-4,4',5,5'-tetraphenyl biimidazole | 1.50 |
| Leuco Crystal Violet | 0.30 |
| Victoria Green (C.I. Pigment Green 18) | 0.05 |
| Aerosol ® OT (sodium dioctyl sulfosuccinate) | 4.0 |
| Methylene chloride | 276.0 |
| Methanol | 24.0 |

The dried photoresist coating was laminated to a scrubbed copper clad glass-epoxy printed circuit substrate using a Riston ® hot roll laminator with the laminator rolls operating at 200 ® F. When normal removal of the polyethylene terephthalate support was attempted, portions of the resist layer were likewise removed indicating gross instant adhesion failure.

Five additional coatings were prepared as above with the components identified in Table 4. Using particular care in removing the support film after lamination the coatings were tested as described in Example 1 and results are as follows:

TABLE 5

| Formulation | | | Properties | | | |
|---|---|---|---|---|---|---|
| Coating | Component | AMOUNT | F & A | IA | P/O | TTS |
| T | None | 0 | 2 | 1 | = | 23 |
| U | Benzotriazole | 0.20 | 0 | 1 | = | 28 |
| V | 5-Chloro benzotriazole | 0.26 | 0 | 1 | = | 25 |
| W | 5-Amino benzotriazole | 0.22 | 0 | 1 | = | 24 |
| X | 1-Methyl benzotriazole | 0.22 | 0 | 1 | = | 26 |
| Y | 1-Hydroxy benzotriazole hydrate | 0.23 | 5 | 3 | ++ | 14 |

Results indicate that none of the tested characteristics are improved by use of the known additives benzotriazole 5-chloro benzotriazole, 5-amino benzotriazole, or 5 methyl benzotriazole. However, 1-hydroxy benzotriazole dramatically improves all tested characteristics.

What is claimed is:

1. In a photopolymerizable composition comprising
(a) at least one nongaseous ethylenically unsaturated compound having a boiling point above 100° C. at normal atmospheric pressure and being capable of forming a high polymer by photoinitiated addition polymerization,
(b) an initiating system activated by actinic radiation, and
(c) a preformed macromolecular binder wherein the improvement comprises incorporation into said composition an additive of a heterocyclic triazole or its hydrate of the formula:

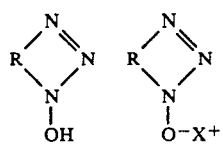

wherein R is an orthoarylene or orthoarylene substituted with alkyl, cyclic alkyl, aryl, aralkyl or alkaryl and X+ is a cation.

2. The composition of claim 1 wherein R is orthoarylene.
3. The composition of claim 1 wherein R is orthoarylene substituted with $C_1$ to $C_{24}$ alkyl group.
4. The composition of claim 1 wherein R is orthoarylene substituted with $C_1$ to $C_8$ alkyl group.
5. The composition of claim 1 wherein R is an aryl group.
6. The composition of claim 1 wherein X is ammonium, sodium, potassium or alkyl substituted ammonium ion.
7. The composition of claim 1 wherein X is ammonium ion.
8. The composition of claim 1 wherein the benzotriazole is 1-hydroxy benzotriazole hydrate.
9. The composition of claim 1 wherein the benzotriazole is 1-hydroxy benzotriazole ammonium salt.
10. The composition of claim 1 wherein the additive is present in an amount from 0.01 to 2.0 percent by weight of the photosensitive composition.
11. The composition of claim 10 wherein the additive is present in an amount from 0.1 to 0.4 percent by weight.

* * * * *